(12) United States Patent
Tille et al.

(10) Patent No.: US 11,619,668 B2
(45) Date of Patent: Apr. 4, 2023

(54) INTEGRATED CIRCUIT WITH SELF-TEST CIRCUIT, METHOD FOR OPERATING AN INTEGRATED CIRCUIT WITH SELF-TEST CIRCUIT, MULTI-CORE PROCESSOR DEVICE AND METHOD FOR OPERATING A MULTI-CORE PROCESSOR DEVICE

(71) Applicant: Infineon Technologies AG, Neubiberg (DE)

(72) Inventors: Daniel Tille, Unterhaching (DE); Heiko Ahrens, Neubiberg (DE); Jens Rosenbusch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 52 days.

(21) Appl. No.: 17/179,955

(22) Filed: Feb. 19, 2021

(65) Prior Publication Data

US 2021/0263099 A1  Aug. 26, 2021

(30) Foreign Application Priority Data

Feb. 21, 2020   (DE) ............... 10 2020 104 595.6

(51) Int. Cl.
*G01R 31/3177*   (2006.01)
*G01R 31/3185*   (2006.01)
(Continued)

(52) U.S. Cl.
CPC .... *G01R 31/3177* (2013.01); *G01R 31/31701* (2013.01); *G01R 31/318536* (2013.01);
(Continued)

(58) Field of Classification Search
CPC ........ G01R 31/3177; G01R 31/318572; G01R 31/31701; G01R 31/318536; G01R 31/318541; G01R 31/318555; G11C 29/12
See application file for complete search history.

(56) References Cited

U.S. PATENT DOCUMENTS 6,691,268 B1   2/2004  Chin
8,461,865 B2   6/2013  Schlagenhaft
(Continued)

FOREIGN PATENT DOCUMENTS

JP   2017-058795 A   3/2017
WO  2010/058248 A1   5/2010

*Primary Examiner* — Cynthia Britt
*Assistant Examiner* — Sazzad Hossain
(74) *Attorney, Agent, or Firm* — Eschweiler & Potashnik, LLC

(57) ABSTRACT

An integrated circuit with self-test circuit is provided. The integrated circuit includes at least one logic circuit, at least one input storage element for storing work data, at least one output storage element, an input test storage element for storing test data, and at least one output test storage element, wherein the logic circuit is selectively connected to the input storage element on the input side, such that the input storage element provides the work data to the logic circuit, or is connected to the input test storage element on the input side, such that the input test storage element provides the test data to the logic circuit, wherein the logic circuit is further connected to the output storage element and the output test storage element on the output side, such that the logic circuit feeds data to the output storage element and/or to the output test storage element, and wherein the output storage element is configured to process the data from the logic circuit if the work data are provided to the logic circuit, and not to process the data from the logic circuit if the test data are provided to the logic circuit.

24 Claims, 6 Drawing Sheets

(51) Int. Cl.
*G01R 31/317* (2006.01)
*G11C 29/12* (2006.01)

(52) U.S. Cl.
CPC .............. *G01R 31/318541* (2013.01); *G01R 31/318555* (2013.01); *G01R 31/318572* (2013.01); *G11C 29/12* (2013.01)

(56) References Cited

U.S. PATENT DOCUMENTS

| | | |
|---|---|---|
| 2011/0221469 A1 | 9/2011 | Schlagenhaft |
| 2015/0377962 A1* | 12/2015 | Daveau ................ G06F 11/267 714/729 |
| 2017/0074931 A1* | 3/2017 | Hasegawa ............... G06F 11/16 |
| 2017/0205461 A1 | 7/2017 | Daveau |
| 2017/0269156 A1 | 9/2017 | Fel |

* cited by examiner

INTEGRATED CIRCUIT WITH SELF-TEST CIRCUIT, METHOD FOR OPERATING AN INTEGRATED CIRCUIT WITH SELF-TEST CIRCUIT, MULTI-CORE PROCESSOR DEVICE AND METHOD FOR OPERATING A MULTI-CORE PROCESSOR DEVICE

REFERENCE TO RELATED APPLICATION

This application claims priority to German Application number 10 2020 104 595.6, filed on Feb. 21, 2020, the contents of which are hereby incorporated by reference in their entirety.

FIELD

The disclosure relates to an integrated circuit with a self-test circuit, a method for operating an integrated circuit with a self-test circuit, a multi-core processor device and a method for operating a multi-core processor device.

BACKGROUND

An electronic system, in particular a safety-relevant electronic system intended to satisfy standards for functional safety such as, for example, ISO 26262, which is relevant to the vehicle sector, must regularly be tested for faults. Built-in or integrated self-test circuits for detecting logic errors, also referred to as "Logic Built-In Self-Test" (LBIST), are at present routine devices for carrying out such tests.

LBIST constitutes a structural procedure. In contrast to functional procedures, such as software-based self-tests, for example, LBIST is not carried out within the system limits of the system to be tested or of the component to be tested, but rather by means of an architecture configured especially therefor, a so-called scan architecture.

SUMMARY

FIG. 1 shows for elucidation a schematic illustration of an integrated circuit with LBIST.

During normal operation of the integrated circuit 100, also referred to as work mode, functional mode or function mode, the functions associated therewith proceed along a functional path 114 (solid line). In this case, storage elements 102 store data values, and a logic circuit 106 carries out combinational logic using the data values, e.g. with Boolean operators being applied.

Scan chains 116, represented as dashed lines, are used during test operation, also referred to as test mode or LBIST mode, to preload the storage elements 102 with test data for better controllability during the test.

A test cycle, thus here an LBIST cycle, has three stages. Firstly, the test data, for example pseudo-random numbers, are loaded, e.g. inserted, into the storage elements 102. This is effected along the scan chains 116.

In a second stage, the test data are processed by the logic circuit 106 (which maps or realizes a combinational logic, for example), which results in detection of possible errors propagating through the logic circuit 106.

In a third stage, the processed test data are expelled into another storage element 102 from the storage elements of the scan chain 116. The scan chains 116 and the corresponding LBIST method are usually established such that the third stage of a test cycle is simultaneously the first stage of a succeeding test cycle. To put it another way, the test data processed and output by one of the logic circuits 106 can form the input data for the succeeding logic circuit 106 along the scan chain 116 in the succeeding test cycle.

The process of carrying out the LBIST is destructive since the storage elements 102 are overwritten with the (e.g. pseudo-random) test data. After the LBIST, the integrated circuit 100 is in an unknown or undefined state and therefore requires reinitialization. The latter is usually achieved by means of a reset and a reboot.

At present LBIST is carried out, for example, during a restart as a so-called "Power-On Self-Test" (POST), i.e. before the integrated circuit 100, or a system having a part constituted by the circuit 100 transitions to normal operation. After the LBIST has been carried out, a reset is triggered and a control unit (e.g. MCU) is restarted (re-booted).

In many cases, however, such a procedure is not suitable for ongoing operation of the integrated circuit 100.

However, there is a need to carry out a system test in the form of an LBIST during normal operation as well. This is referred to as "Mission-Mode LBIST".

Two procedures are conceivable for realizing an LBIST during normal operation:
1. The state of the system is stored before the LBIST is carried out and is restored afterward.
2. The system is reinitialized after the LBIST has been carried out.

During the time duration in which the three LBIST stages described above are carried out, normal operation of the system is interrupted. That is to say, a conventional LBIST architecture, irrespective of which of the two procedures mentioned above is chosen, results in a significant non-availability of the system.

In cases in which such a non-availability is unacceptable, LBIST is simply not usable, and so safety measures have to be realized in some other way, e.g. by means of hardware solutions, which are typically accompanied by an increased area requirement, or by means of a software-based self-test, which typically enables low coverage, i.e. is not available for the entire system.

In various embodiments, an LBIST scheme is provided which maintains a state of the storage elements. That is to say, carrying out the LBIST does not require a reset or a reinitialization. An availability of a tested system, e.g. of an integrated circuit is thus increased, which improves usability of the LBIST in particular in the case of an implementation during normal operation.

In various embodiments, a dedicated stimulation and response path is provided for carrying out the LBIST.

Expressed in an illustrative way, in various embodiments, the operation network is separated from the test network as much as possible (i.e. apart from the logic circuit to be tested). That enables the test data to be loaded at the same time as normal operation of the system (i.e. in the background), without disturbing normal operation.

In various embodiments, a nondestructively readable LBIST architecture (e.g. as part of an integrated circuit) is provided which enables stimulation and response data to be handled in parallel with (normal) operation of the system.

BRIEF DESCRIPTION OF THE DRAWINGS

Embodiments of the disclosure are illustrated in the figures and are explained in greater detail below.

In the figures.

DETAILED DESCRIPTION

In the following detailed description, reference is made to the accompanying drawings, which form part of this application and show for illustrative purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in the restrictive sense, and the scope of protection of the present disclosure is defined by the appended claims.

In the context of this description, the terms "connected", "attached" and "coupled" are used to describe both a direct and an indirect connection, a direct or indirect attachment and a direct or indirect coupling. In the figures, identical or similar elements are provided with identical reference signs, insofar as this is expedient.

In order to facilitate an explanation of various embodiments, in some instances lower-case letters are appended to a generic reference sign.

Figure 1:
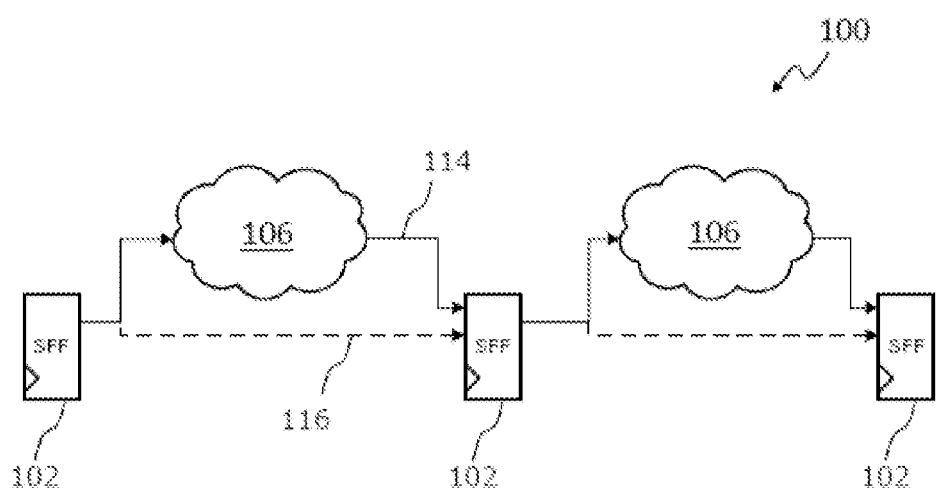
FIG. 1 shows a schematic illustration of an integrated circuit with LBIST.
Figure 2:
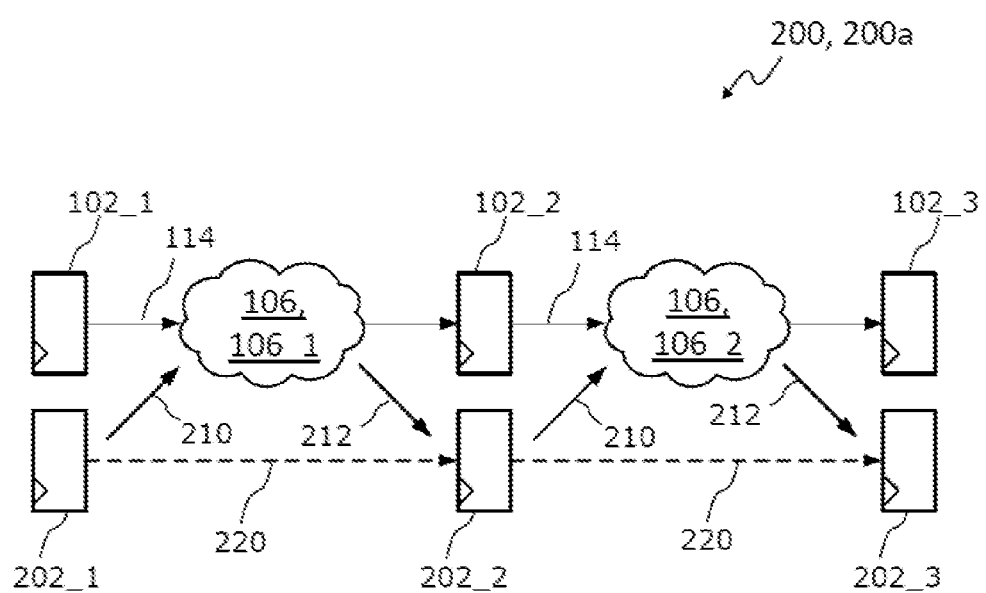
FIG. 2 shows a schematic illustration of an integrated circuit with LBIST in accordance with various embodiments.
Figure 3A:
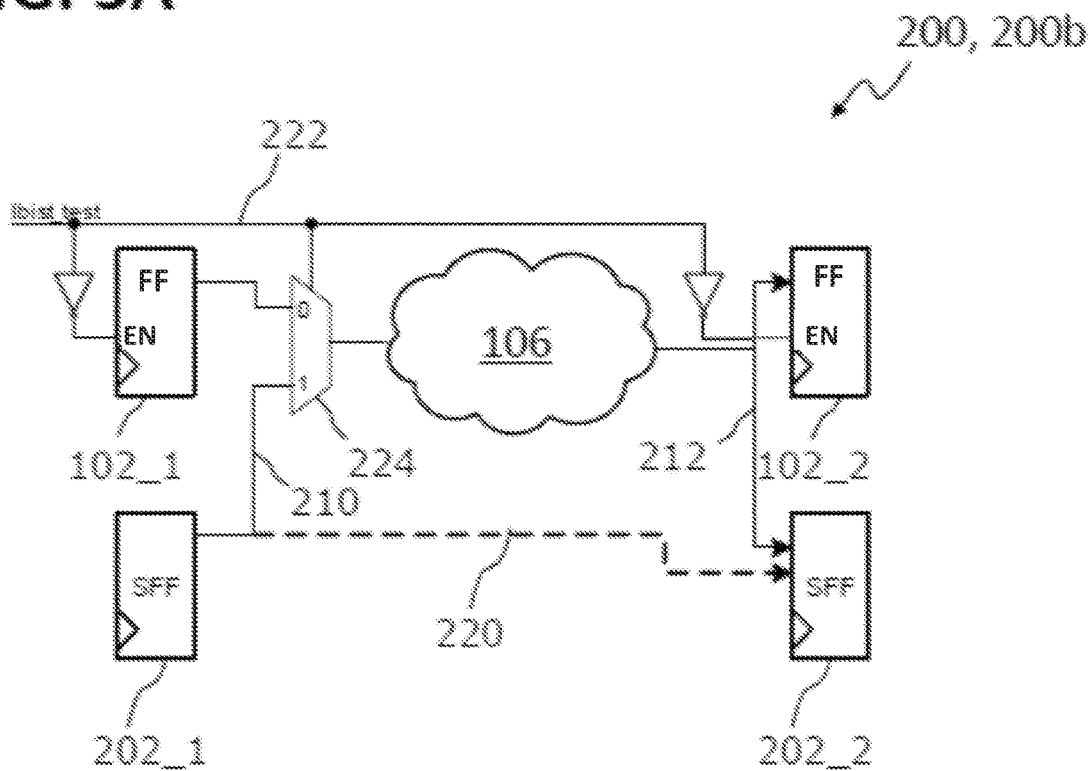
FIGS. 3A and 3B each show a simplified schematic circuit diagram of an integrated circuit with LBIST in accordance with various embodiments.
Figure 3B:
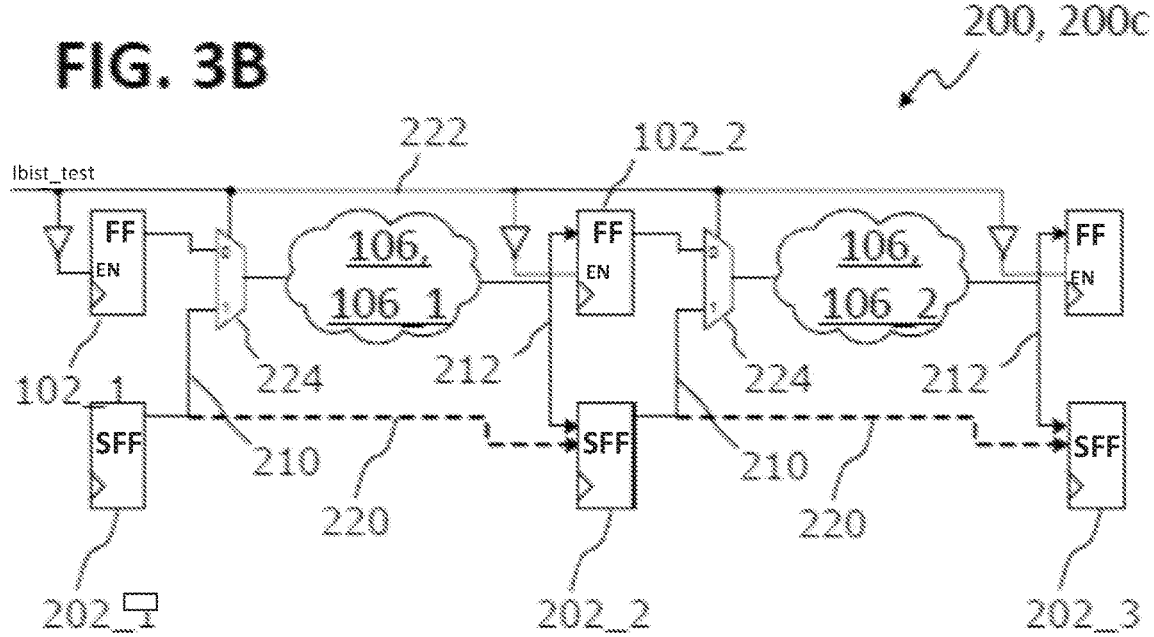

FIG. 2 shows a schematic illustration of an integrated circuit 200 with a built-in self-test circuit for detecting logic errors (LBIST), in accordance with various embodiments, and FIGS. 3A and 3B each show a simplified schematic circuit diagram of an integrated circuit 200 with LBIST in accordance with various embodiments. Reference is made to FIG. 2, FIG. 3A and FIG. 3B in the following description.

In various embodiments, the integrated circuit 200 with the built-in self-test circuit for detecting logic errors can comprise a logic circuit 106, an input storage element 102_1 for storing work data, an output storage element 102_2, an input test storage element 202_1 for storing test data and an output test storage element 202_2. In various embodiments, each of the storage elements 102 and each of the test storage elements 202 can comprise at least one flip-flop, typically a plurality of flip-flops, or other storage elements, such as latches, for example.

With regard to various aspects, the LBIST implementation can be based on a so-called STUMPS (Self-Test Using MISR and Parallel Shift Register Sequence Generator) architecture.

Accordingly, test data that are loaded for example into the input test storage element 202_1 or optionally further, e.g. all, test storage elements 202 can be provided, for example, by means of a linear feedback shift register (LFSR)(not shown), which can be configured or used to generate a deterministic sequence of pseudo-random numbers.

Furthermore, the output test storage element 202_1 or each of the test storage elements 202_1 which receives processed test data generated by the logic circuit 106 can provide the processed test data to a multiple input signature register (MISR)(not shown), which can be configured or used for examining the output response.

In various embodiments, the integrated circuit 200 can be configured in such a way that the logic circuit 106 is optionally connected (e.g. electrically conductively) to the input storage element 102_1 on the input side, such that the input storage element 102_1 provides the work data to the logic circuit 106. On the output side, the logic circuit 106 can be connected (e.g. electrically conductively) to the output storage element 102_2, such that the logic circuit 106 feeds the work data processed by the logic circuit 106. In this state the integrated circuit 200 is in the work mode (also referred to as work operation, normal operation or mission mode). The output storage element 102_2 can then be activated. To put it another way, the output storage element 102_2 can be in a state in which the work data processed by the logic circuit 106 are processed, e.g. are stored in the output storage element 102_2 or the like. In the work mode, the logic circuit 106 can furthermore be connected to the output test storage element 202_2.

Alternatively the logic circuit 106 is connected (e.g. electrically conductively) to the input test storage element 202_1 on the input side, such that the input test storage element 202_1 provides the test data to the logic circuit 106. On the output side, the logic circuit can be connected (e.g. electrically conductively) to the output test storage element 202_2, such that the logic circuit 106 feeds the test data processed by the logic circuit 106. In this state the integrated circuit 200 is in the test mode (also referred to as test operation). In the test mode, the logic circuit 106 can furthermore be connected to the output storage element 102_2 and feed the processed test data to the output storage element 102_2. However, the output storage element 102_2 can be deactivated in the test mode. To put it another way, the output storage element can be switched or have been switched into a state in which the data fed thereto are not processed (but rather ignored), e.g. are not stored in the output storage element 102_2 or the like.

In various embodiments, the connection of the logic circuit 106 to the output storage element 102_2 and respectively the output test storage element 202_2 can be embodied such that the logic circuit 106 is not permanently connected to the output storage element 102_2 and the output test storage element 202_2, but rather is optionally connectable to both. In that case, for example, the logic circuit 106 in the work mode can be connected only to the output storage element 102_2 on the output side, and in the test mode can be connected only to the output test storage element 202_2 on the output side. A demultiplexer, for example, can be used for this purpose.

In various embodiments, the integrated circuit 200 can furthermore comprise a controller, which can be configured or used to switch over between the work mode and the test mode, or vice versa.

The above embodiment of the integrated circuit 200 means that those circuit elements which are used in the work mode, apart from the logic circuit 106 itself that is to be tested, are substantially unaffected by the self-test. In particular, the input storage element 102_1 and the output storage element 102_2 are not overwritten with test data, rather the latter are provided directly by the input test storage element 202_1 of the logic circuit 106, and respectively are received by the output test storage element 202_2 from the logic circuit 106 and are ignored in the output storage element 102_2.

The basic functionality of the various embodiments is particularly readily evident on the basis of the schematic illustration from FIG. 2. In the work mode the system application runs via an application network e.g. of storage elements 102_1, 102_2, 102_3, data lines 114 and logic circuits 106, e.g. logic gates.

Provided in parallel therewith is a substantially separate scan network comprising the separate test storage elements 202_1, 202_2, 202_3, dedicated data lines between the storage elements 202 and the logic circuit 106 (data lines 210, 212) and between the storage elements 202 among one another (data lines 220), wherein the logic circuit 106 to be tested is also part of the test network.

FIG. 2 illustrates, as part of the integrated circuit 200, 200a, two logic circuits 106 to be tested, which are connectable or are connected to form a scan chain in particular for test purposes. In various embodiments, the scan chain can comprise substantially any desired number of additional logic circuits 106 with in each case an additional output storage element 102 and an additional test storage element 202. In this case, the additional elements can be integrated into the circuit 200 in a similar manner to that shown by the extension from one logic circuit 106 as in the integrated circuit 200, 200b in FIG. 3A to two logic circuits 106 as in the circuit 200, 200c in FIG. 3B.

To put it another way, in various embodiments, the integrated circuit 200 can comprise at least one additional output storage element 102_3 and at least one additional output test storage element 202_3, wherein the at least one logic circuit 106 comprises a plurality of logic circuits 106_1, 106_2, and wherein during the connection of the logic circuit 106 to the input test storage element 202_1 and to the output test storage element 202_2, the plurality of logic circuits 106_1, 106_2 together with the input test storage element 202_1, the output test storage element 202_2 and the at least one additional output test storage element 202_3 forms a (test) scan chain.

In this case, the at least one additional output storage element 102_3—just like the output storage element 102_2 and the input storage element 102_1—is not part of the scan chain.

The logic circuit 106_1 connected to the input test storage element 202_1 and to the output test storage element 202_2 can form, together with the input test storage element 202_1 and the output test storage element 202_2, a first chain link of the scan chain. Each additional chain link of the scan chain can comprise one of the plurality of logic circuits 106, which is connected to the output test storage element 202_2 of the preceding chain link on the input side and is connected to a further output test storage element 202_3 of the output test storage elements 202_2, 202_3, ..., 202_n on the output side.

During the test mode, when the logic circuits 106 are interconnected with the test storage elements 202_1, 202_2, 202_3, ..., 202_n to form the scan chain, the output test storage element 202_2, 202_3 of the preceding chain link can provide to each of the logic circuits 106 of the additional chain links the test data processed by the logic circuit 106 of the preceding chain link.

Furthermore, each of the logic circuits 106 of the additional chain links can feed the test data processed by it to the output test storage element 202_2, 202_3 on the output side. Although the test data processed by the logic circuits 106 can in each case also be fed to the output storage elements 102_2, 102_3 etc. on the output side, the output storage elements 102_2, 102_3 etc. can be, or have been, deactivated in the test mode. The processed test data fed can then be ignored. The state of the work mode can thus be maintained in the input and output storage elements.

Owing to the separate scan network comprising the separate test storage elements 202, the scan chain can already be loaded with test data in parallel during the work mode, without the application in the application network being impaired. In this case, only one of the test storage elements 202, for example the input test storage element 202_1 or the output test storage element 202_2, can be loaded with the test data, or a plurality or all of the test storage elements 202 can be loaded with the test data, for example using the data line 220.

When the test storage elements 202 have been completely loaded as desired, it is possible to switch over to the test mode and carry out the test. For this purpose, the application can be ended, and all storage elements 102 can retain their current value. The logic circuit 106 that is intended to be tested (which maps or realizes a combinational logic, for example) is stimulated by the test values stored in the test storage elements 202. Test responses generated by the logic circuit 106 are stored only in the test storage elements 202. Even if the test responses continue to be fed to the output storage element 102_2 in the test mode, the output storage element 102_2 can be deactivated. The test responses can be expelled from the storage elements 202 by means of the scan lines 220. Already in the course of this, the normal application can be continued, specifically exactly at the point at which it was interrupted.

This enables the state which storage elements (e.g. the input storage element 102_1 and the output storage element 102_2) of the integrated circuit 200 have before the test to be kept stored until the test has been concluded and normal operation can be resumed, i.e. the work mode can be continued. The work mode can be continued seamlessly, without a recovery having to be performed, because the states are still present unchanged in the storage elements 102.

Furthermore, this enables the test mode to be prepared as early as during the work mode, by means of the test data being loaded into the input test storage element 202_1. Owing to the separation of the normal work or application storage elements 102 (e.g. input storage element 102_1, output storage element 102_2) from the test storage elements 202 (e.g. input test storage element 202_1, output test storage element 202_2), this measure can be effected without disturbing normal operation.

By way of example, the input test storage element 202_1, if it is a linear feedback shift register, can be configured or used to generate a deterministic sequence of pseudo-random numbers as early as during the work mode. Upon the beginning of the test mode, said numbers can be used as test data for the self-test and be provided to the logic circuit 106 to be tested.

In order to switch over between the test mode and the work mode, the integrated circuit 200 can comprise, for example as part of the controller, a multiplexer 224. The multiplexer 224 can be a selection circuit that makes it possible to select one from a plurality of input signals (here e.g. work data and test data) and to switch it through to an output.

Furthermore, the integrated circuit 200, in particular the controller, can be configured or used to provide a switching signal 222 for the purpose of switching over the integrated circuit 200 between the work mode and the test mode.

For the purpose of switching to the work mode, the switching signal 222 can have a first signal value, for example 0. For the purpose of switching to the test mode, the switching signal can have a second signal value, for example 1. Depending on a construction of the storage elements 102 and the multiplexer 224, the signal value in the test mode can be chosen such that, owing to the switching signal value provided, the storage elements 102 are or become transparent and retain their state from before entry into the test mode, and that furthermore the multiplexer 224, upon provision of the signal value for entry into the test mode, is switched such that the test signal from the test storage element 202_1 is provided to the logic circuit 106 by means of the multiplexer 224.

In various embodiments, the switching signal 222 can be provided to the multiplexer 224, for example at a control input of the multiplexer. Furthermore, the switching signal 222 can be provided to the output storage element 102_2, for example, in a case where the output storage element 102_2 comprises a flip-flop, to an enable input or to a clock enable input. If an output-side demultiplexer is present, the switching signal 222 can likewise be fed thereto for the purpose of switching over between the work mode and the test mode.

Furthermore, the switching signal 222 can be provided to the input storage element 102_1, for example, in a case where the input storage element 102_1 comprises a flip-flop, to the enable input thereof or to the clock enable input thereof.

The switching signal 222 can, as described above, cause the effect that upon or after the switching over to the test mode, the output storage element 102_2 and optionally the input storage element 102_1 are deactivated (or optionally a connection of the output storage element 102_2 to the logic circuit is disconnected) in such a way that they retain their last work mode state which they had before entry into the test mode.

Operation of the integrated circuit 200 is explained with reference to FIG. 3A.

As explained above, the input storage element 102_1 and the output storage element 102_2 can comprise or consist of flip-flops. For each of the flip-flops 102, a test flip-flop 202 (also referred to as scan flip-flop owing to the scan chains that can be formed) is added to the circuit 200, 200b, and is substantially separated from the logic circuit ("Mission Logic") 106 during the work mode.

During the work mode, the switching signal 222, also designated by Ibist_test, can assume the signal value 0.

That means that, during the work mode, the flip-flops 102 are active and the logic circuit 106 is supplied by them. Furthermore, an output of the logic circuit is led to the flip-flops 102.

In parallel therewith, data can be loaded into the scan flip-flops 202. That can be performed by means of a shift process which, in various embodiments, can be carried out in a manner following a lower clock frequency (than the main application), whereby energy can be saved.

For entry into the test mode (the LBIST mode), the signal value of the switching signal 222 can be changed, for example switched over from Ibist_test=0 to Ibist_test=1.

That means that the flip-flops 102 are deactivated and therefore retain their value at the time of deactivation.

The test data are then fed to the logic circuit 106, and the processed test data are fed to the test flip-flops 202.

Instead of the enable flip-flops described, it is possible to use other state store devices that can be switched over between active and inactive, for example flip-flops that make clock gating possible.

After any desired number of evaluation cycles, the signal value of the switching signal 222 can be set to 0 again. The integrated circuit 200 thus receives its normal operation again, specifically exactly at the point at which it was interrupted.

In parallel therewith, the processed data stored in the test flip-flops 202 can be expelled, for example along the scan chain or the line 220 into the MISR, e.g. for an evaluation.

Figure 4A:
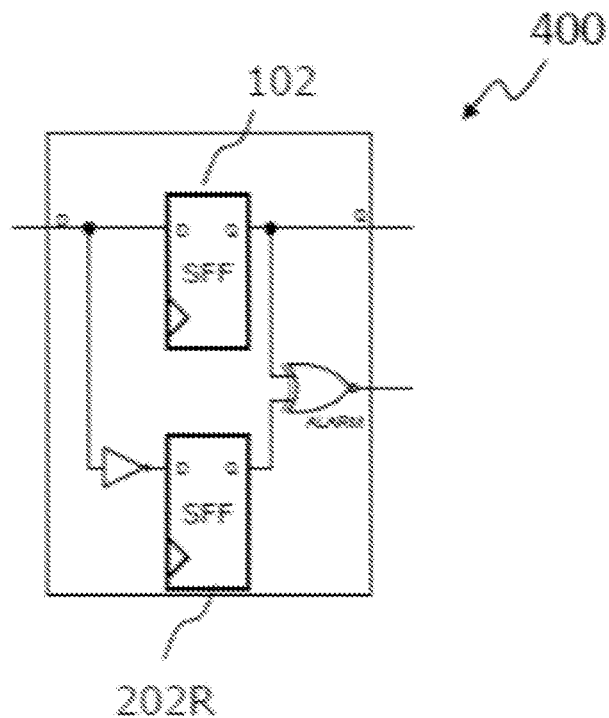
FIG. 4A shows a partial view of a simplified schematic circuit diagram of an integrated circuit with redundancy function.

FIG. 4A shows a part view of a simplified schematic circuit diagram of an integrated circuit 400 with a redundancy function.

Figure 4B:
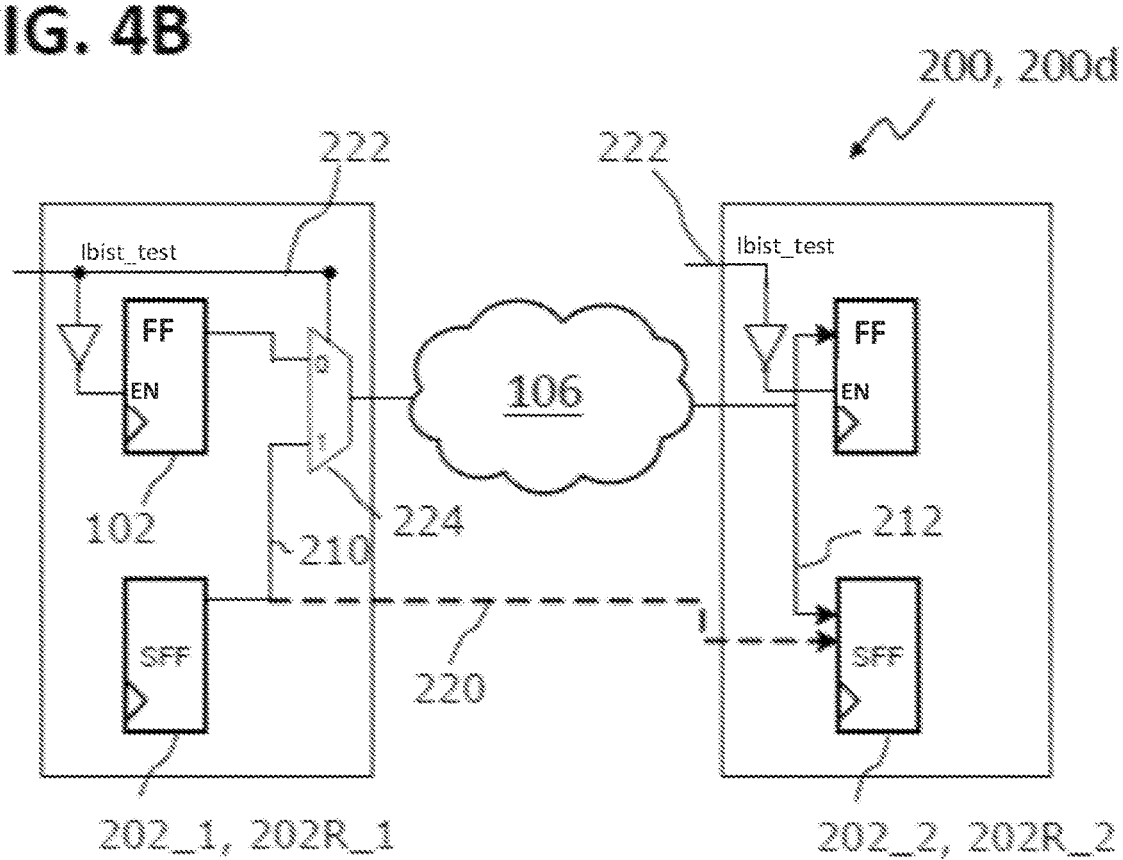
FIG. 4B shows a simplified schematic circuit diagram of an integrated circuit with LBIST and redundancy function in accordance with various embodiments.

FIG. 4B shows a simplified schematic circuit diagram of an integrated circuit 200 with LBIST and a redundancy function in accordance with various embodiments.

Inserting additional storage elements 202 into the integrated circuit 200 can result in an increased space requirement at the chip in which the integrated circuit 200 is formed.

However, integrated circuits 400 as shown in FIG. 4A are often equipped at least in part or in full with safety flip-flops 202R for their flip-flops 102, which can be configured to store data redundantly with respect to the flip-flop 102, to compare data and to provide an alarm in the event of a detected difference. It is thus possible to increase robustness vis à vis so-called Single Event Upsets (SOE), such as can be triggered by cosmic radiation, for example. That is illustrated in FIG. 4A.

In various embodiments, the safety flip-flops 202R can be incorporated into the integrated circuit 200, 200d such that they can fulfill a dual function, namely as test storage element 202 during the test mode, and as redundancy storage device 202R during the work mode, i.e. during normal operation. That is illustrated in FIG. 4B, where the circuit elements necessary for the alarm function have been omitted, however, for the sake of clarity.

To put it another way, in various embodiments, the input test storage element 202_1 can be configured to form, in the work mode, a redundant input safety storage element 202R_1 with respect to the input storage element 102_1, and/or wherein the output test storage element 202_2 can be configured to form, in the work mode, a redundant output safety storage element 202R_2 with respect to the output storage element 102_2. If more than two storage elements and/or test storage elements are present, a test storage element 202, which is usable as a safety storage element 202R in the work mode, can be assigned to further, e.g. all further, storage elements 102.

In order to further reduce a (chip) area requirement, the LBIST scheme, in accordance with various embodiments, can be used in a restricted manner, such that it tests only a part of the entire logic, e.g. (only) a safety system, in order to detect latent errors.

Figure 5:
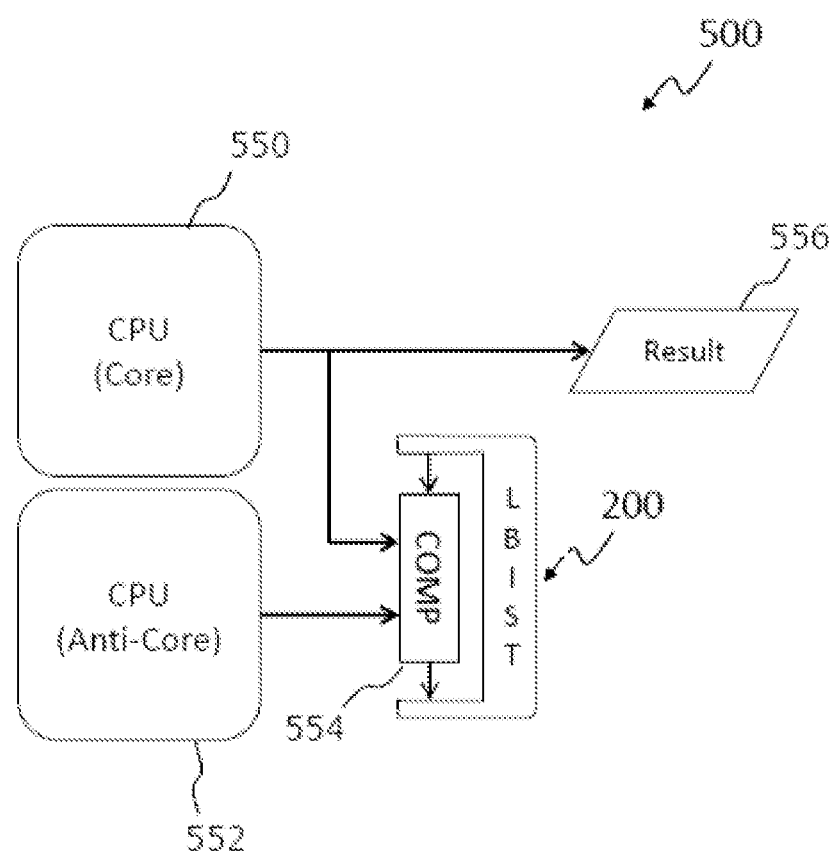
FIG. 5 shows a schematic illustration of a multi-core processor device with LBIST in accordance with various embodiments.

FIG. 5 is a schematic illustration of a multi-core processor device 500 with LBIST 200 in accordance with various embodiments.

The multi-core processor device 500 can comprise a processor core 550 (Core) and a redundant second processor core 552 (Anti-Core), that is to say that the second processor core 552 can obtain the same work data as the processor core 550, and can process them in the same way. Data provided by both of them can be compared in a comparator 554 (e.g. a lockstep comparator) and the result 556 of the comparison can be output, for example, as an alarm in the event of non-correspondence.

In various embodiments, the multi-core processor device 500 can be configured such that only the comparator 554 is subjected to a self-test by means of the LBIST 200.

That means that the main core 550 (and also the redundant second core 552) is not impaired by the implementation of the LBIST.

An availability of the processor core 550 is thus increased. Since the LBIST implementation is restricted to the comparator 554, it does not impair applications implemented on the main processor core.

Accordingly, real-time program execution is maintained. The (lockstep) comparator 554 can be able to detect individual errors. This detection is interrupted only for the LBIST tests, specifically actually only for the time required for testing the logic circuit 106 itself.

Figure 6:
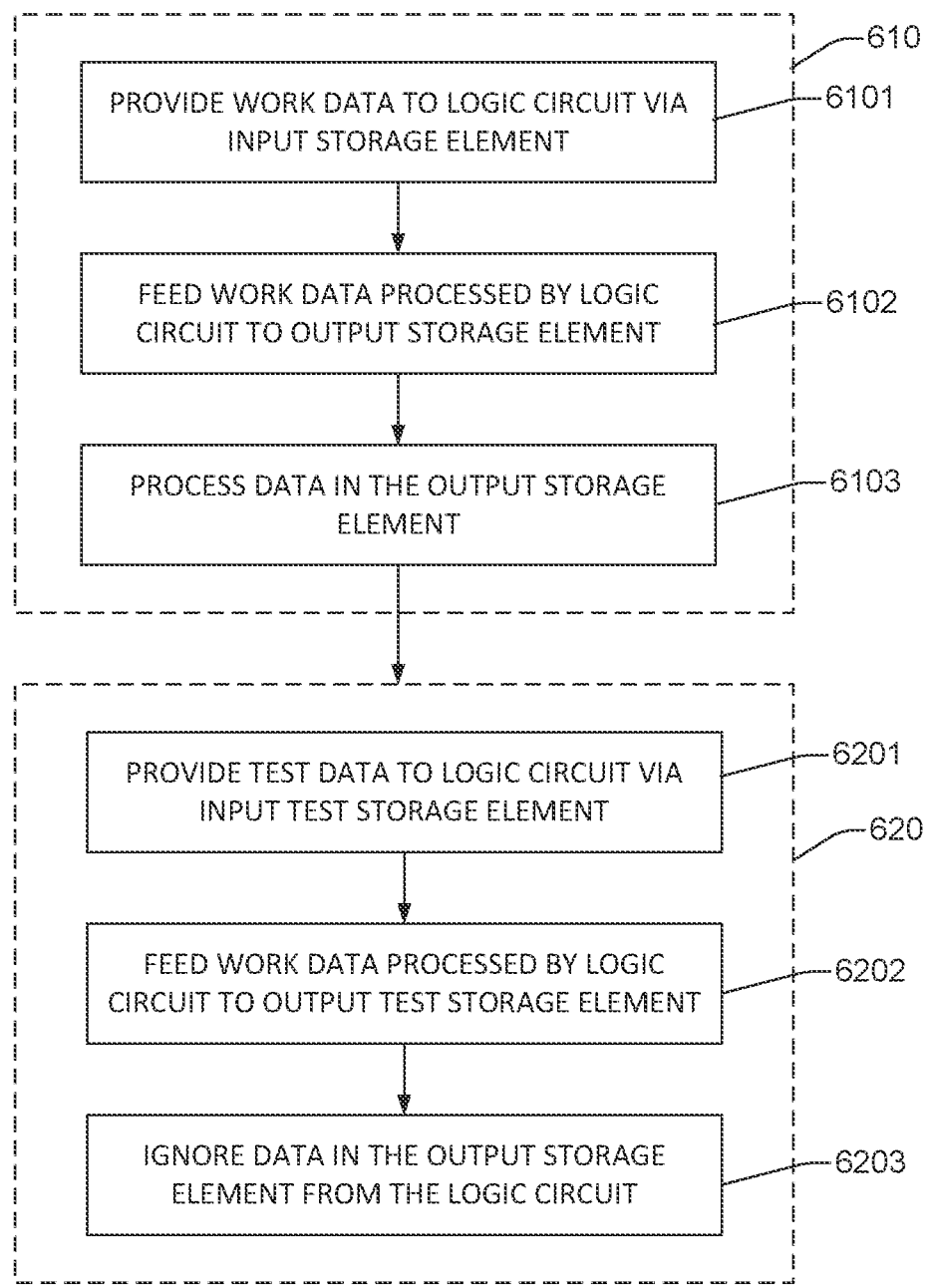
FIG. 6 shows a flow diagram of a method for operating an integrated circuit with LBIST in accordance with various embodiments.

FIG. 6 shows a flow diagram 600 of a method for operating an integrated circuit with self-test circuit in accordance with various embodiments.

The integrated circuit with self-test circuit can comprise at least one logic circuit, at least one input storage element for storing work data, at least one output storage element, at least one input test storage element for storing test data and at least one output test storage element, wherein the logic circuit is connected or connectable to the output storage element and to the output test storage element on the output side.

The method can optionally comprise connecting the logic circuit to the input storage element on the input side (at 610), and can then furthermore comprise providing work data to the logic circuit by means of the input storage element (at 6101), feeding the work data processed by the logic circuit to the output storage element (at 6102) and processing the data from the logic circuit in the output storage element (at 6103), or connecting the logic circuit to the input test storage element on the input side (at 620), and can then furthermore comprise providing test data to the logic circuit by means of the input test storage element (at 6201), feeding the work data processed by the logic circuit to the output test storage element (at 6202) and ignoring the data from the logic circuit in the output storage element (at 6203).

As explained above, a nondestructive LBIST architecture is provided which enables handling of stimulus and response in parallel with the system implementation.

That can be advantageous to the effect that the system state can be maintained in an uncomplicated manner. By way of example, complicated reinitialization is not necessary.

Furthermore, because the storage elements can be loaded with the test data in the background, an interruption of the system implementation can be limited to the phase of the actual testing of the logic (also referred to as "capture phase"), which significantly increases availability of the system.

Some embodiments are specified in summary hereinafter.

Embodiment 1 is an integrated circuit with self-test circuit. The integrated circuit comprises at least one logic circuit, at least one input storage element for storing work data, at least one output storage element, at least one input test storage element for storing test data, and at least one output test storage element, wherein the logic circuit is optionally connected to the input storage element on the input side, such that the input storage element provides the work data to the logic circuit, or is connected to the input test storage element on the input side, such that the input test storage element provides the test data to the logic circuit, wherein the logic circuit is furthermore connected or connectable to the output storage element and the output test storage element on the output side, such that the logic circuit feeds data to the output storage element and/or to the output test storage element, and wherein the output storage element is configured to process the data from the logic circuit if the work data are provided to the logic circuit, and not to process the data from the logic circuit if the test data are provided to the logic circuit.

Embodiment 2 is an integrated circuit in accordance with embodiment 1, furthermore comprising a controller configured to switch over between the connection of the logic circuit to the input storage element and the activation of the output storage element, such that the work data fed to it are processed, on the one hand, and the connection of the logic circuit to the input test storage element and the deactivation of the output storage element, such that the test data fed to it are ignored, on the other hand, or vice versa.

Embodiment 3 is an integrated circuit in accordance with embodiment 1 or 2, furthermore configured to load the test data into the input test storage element while the logic circuit is connected to the input storage element and the output storage element.

Embodiment 4 is an integrated circuit in accordance with embodiment 2 or 3, wherein the controller comprises a multiplexer.

Embodiment 5 is an integrated circuit in accordance with any of embodiments 2 to 4, wherein the controller is further configured to provide a switching signal having a first signal value for the purpose of connecting the logic circuit to the input storage element and activating the output storage element, and to provide the switching signal having a second signal value for the purpose of connecting the logic circuit to the input test storage element and deactivating the output storage element.

Embodiment 6 is an integrated circuit in accordance with embodiment 5, wherein the controller is furthermore configured for providing the switching signal at least to the multiplexer and to the output storage element.

Embodiment 7 is an integrated circuit in accordance with any of embodiments 1 to 5, wherein the input storage element, the output storage element, the input test storage element and the output test storage element each comprises at least one flip-flop.

Embodiment 8 is an integrated circuit in accordance with embodiments 5 and 7, wherein the at least one flip-flop of the output storage element has an enable input and/or a clock enable input, and wherein the controller is furthermore configured to provide the switching signal to the enable input or to the clock enable input.

Embodiment 9 is an integrated circuit in accordance with embodiment 4 and 5, wherein the multiplexer has a control input and the controller is configured to provide the switching signal to the control input of the multiplexer.

Embodiment 10 is an integrated circuit in accordance with any of embodiments 1 to 9, wherein the input test storage element is configured to form in the work mode an input safety storage element configured to redundantly store the data stored in the input storage element, and/or wherein the output test storage element is configured to form in the work mode an output safety storage element configured to redundantly store the data stored in the output storage element.

Embodiment 11 is an integrated circuit in accordance with any of embodiments 1 to 10, furthermore comprising: at least one additional output storage element, and at least one additional output test storage element, wherein the at least one logic circuit comprises a plurality of logic circuits, and wherein during the connection of the logic circuit to the input test storage element and the output test storage element the plurality of logic circuits together with the input test storage element, the output test storage element and the at least one additional output test storage element forms a scan chain, wherein the at least one additional output storage element is not part of the scan chain.

Embodiment 12 is an integrated circuit in accordance with embodiment 11, wherein the logic circuit connected to the input test storage element and to the output test storage element forms, together with the input test storage element and the output test storage element, a first chain link of the scan chain, and wherein each additional chain link of the scan chain comprises one of the plurality of logic circuits, which is connected to the output test storage element of the preceding chain link on the input side and is connected to a further output test storage element on the output side.

Embodiment 13 is an integrated circuit in accordance with embodiment 12, wherein the output test storage element of the preceding chain link provides to each of the logic circuits of the additional chain links the test data processed by the logic circuit of the preceding chain link, and wherein each of the logic circuits of the additional chain links feeds the test data processed by it to the output test storage element on the output side.

Embodiment 14 is a multi-core processor device. The multi-core processor device comprises a first processor configured to process and output data, a second processor configured to process and output the same data, and a comparator, which forms the integrated circuit in accordance with any of embodiments 1 to 13 and is furthermore configured to compare the data output by the first processor with the data output by the second processor.

Embodiment 15 is a method for operating an integrated circuit with self-test circuit, said integrated circuit comprising at least one logic circuit, at least one input storage element for storing work data, at least one output storage element, at least one input test storage element for storing test data and at least one output test storage element, wherein the logic circuit is connected to the output storage element and to the output test storage element on the output side. The method optionally comprises connecting the logic circuit to the input storage element on the input side, and then furthermore comprises providing work data to the logic circuit by means of the input storage element, feeding the work data processed by the logic circuit to the output storage element, and processing the data from the logic circuit in the output storage element, or connecting the logic circuit to the input test storage element on the input side, and then further comprises providing test data to the logic circuit by means of the input test storage element, feeding the work data processed by the logic circuit to the output test storage element and to the output storage element, and ignoring the data from the logic circuit in the output storage element.

Embodiment 16 is a method in accordance with embodiment 15, furthermore comprising switching over between the connection of the logic circuit to the input storage element and the activation of the output storage element, on the one hand, and the connection of the logic circuit to the input test storage element and the deactivation of the output test storage element, on the other hand, or vice versa.

Embodiment 17 is a method in accordance with embodiment 15 or 16, furthermore comprising loading the test data into the input test storage element while the logic circuit is connected to the input storage element.

Embodiment 18 is a method in accordance with embodiment 16 or 17, wherein the integrated circuit comprises a controller, which optionally comprises a multiplexer.

Embodiment 19 is a method in accordance with any of embodiments 16 to 18, furthermore alternately comprising: providing a switching signal having a first signal value for the purpose of connecting the logic circuit to the input storage element and for the purpose of activating the output storage element, and providing a switching signal having a second signal value for the purpose of connecting the logic circuit to the input test storage element and for the purpose of deactivating the output test storage element.

Embodiment 20 is a method in accordance with embodiments 18 and 19, wherein the switching signal is provided at least to the multiplexer and to the output storage element.

Embodiment 21 is a method in accordance with any of embodiments 15 to 20, wherein the input storage element, the output storage element, the input test storage element and the output test storage element each comprises at least one flip-flop.

Embodiment 22 is a method in accordance with embodiment 19 and 21, wherein the at least one flip-flop of the output storage element has an enable input and/or a clock enable input, to which the switching signal is provided.

Embodiment 23 is a method in accordance with any of embodiments 19 to 22, wherein the switching signal is provided to a control input of the multiplexer.

Embodiment 24 is a method in accordance with any of embodiments 15 to 23, wherein the input test storage element is configured to form an input safety storage element in the work mode, wherein the method furthermore comprises redundantly storing in the input safety storage element the work data stored in the input storage element, and/or wherein the output test storage element is configured to form an output safety storage element in the work mode, wherein the method furthermore comprises redundantly storing in the output safety storage element the work data stored in the output storage element.

Embodiment 25 is a method in accordance with any of embodiments 15 to 24, wherein the integrated circuit furthermore comprises at least one additional output storage element, and at least one additional output test storage element, wherein the at least one logic circuit comprises a plurality of logic circuits, and wherein during the connection of the logic circuit to the input test storage element and the output test storage element the plurality of logic circuits together with the input test storage element, the output test storage element and the at least one additional output test storage element forms a scan chain, wherein the at least one additional output storage element is not part of the scan chain.

Embodiment 26 is a method in accordance with embodiment 25, wherein the logic circuit connected to the input test storage element and to the output test storage element forms, together with the input test storage element and the output test storage element, a first chain link of the scan chain, and wherein each additional chain link of the scan chain comprises one of the plurality of logic circuits, which is connected to the output test storage element of the preceding chain link on the input side and is connected to a further output test storage element on the output side.

Embodiment 27 is a method in accordance with embodiment 26, wherein the method furthermore comprises providing the test data processed by the logic circuit of one of the chain links as test data to the logic circuit of the succeeding chain link, and feeding the test data processed by the logic circuit of the last chain link to the output test storage element connected to the logic circuit of the last chain link on the output side.

Embodiment 28 is a method for operating a multi-core processor device comprising a first processor, a second processor and a comparator. The method comprises alternating between a work phase and a self-test phase, wherein the work phase comprises providing, by means of the first processor, first data to the comparator, providing, by means of the second processor, second data to the comparator, and comparing the first data with the second data, wherein the self-test phase comprises carrying out the method for operating an integrated circuit with self-test circuit in accordance with any of embodiments 15 to 27, wherein the comparator forms the integrated circuit.

Further advantageous configurations of the device are evident from the description of the method, and vice versa.

What is claimed is:

1. An integrated circuit with self-test circuit, comprising:
    at least one logic circuit;
    at least one input storage element for storing work data;
    at least one output storage element;
    at least one input test storage element for storing test data; and
    at least one output test storage element;
    wherein the logic circuit is selectively connected to the input storage element on an input side of the logic circuit, such that the input storage element is connected to the logic circuit, and provides the work data to the logic circuit in a work mode, or
    is selectively connected to the input test storage element on the input side of the logic circuit, such that the input test storage element is connected to the logic circuit, and provides the test data to the logic circuit in a test mode;
    circuitry configured to load the test data into the input test storage element while the logic circuit is connected to the input storage element and the output storage element;
    wherein the logic circuit is furthermore connected or selectively connected to both the output storage element and the output test storage element on an output side of the logic circuit, such that when the logic circuit is connected to the output storage element the logic circuit feeds data to the output storage element, and when the logic circuit is connected to the output test storage element the logic circuit feeds data to the output test storage element, and when the logic circuit is connected to both the output storage element and to the output test storage element the logic circuit feeds data to both the output storage element and the output test storage element;
    wherein the output storage element is configured to process the data from the logic circuit when the work data are provided to the logic circuit in the work mode, and not to process the data from the logic circuit when the test data are provided to the logic circuit in the test mode.

2. The integrated circuit as claimed in claim 1, further comprising:
    a controller configured to switch over between:
        the connection of the input side of the logic circuit to the input storage element and an activation of the output storage element, such that the output storage element processes the work data fed thereto; and
        the connection of the input side of the logic circuit to the input test storage element and a deactivation of the output storage element, such that the work data fed to the output storage element are ignored, or vice versa.

3. The integrated circuit as claimed in claim 2, wherein the controller comprises a multiplexer.

4. The integrated circuit as claimed in claim 3, wherein the controller is configured to:
    provide a switching signal having a first signal value for the purpose of connecting the input side of the logic circuit to the input storage element and activating the output storage element; and
    provide the switching signal having a second signal value for the purpose of connecting the logic circuit to the input side of the input test storage element and deactivating the output storage element, and
    wherein the multiplexer has a control input and the controller is configured to provide the switching signal to the control input of the multiplexer.

5. The integrated circuit as claimed in claim 2, wherein the controller is configured to:
    provide a switching signal having a first signal value for the purpose of connecting the input side of the logic circuit to the input storage element and activating the output storage element; and
    provide the switching signal having a second signal value for the purpose of connecting the logic circuit to the input side of the input test storage element and deactivating the output storage element.

6. The integrated circuit as claimed in claim 5, wherein the controller is further configured to provide the switching signal at least to a multiplexer and to the output storage element.

7. The integrated circuit as claimed in claim 5, wherein the input storage element, the output storage element, the input test storage element and the output test storage element each comprises at least one flip-flop, wherein the at least one flip-flop of the output storage element has an enable input and/or a clock enable input, and wherein the controller is further configured to provide the switching signal to the enable input or to the clock enable input.

8. The integrated circuit as claimed in claim 1, wherein the input storage element, the output storage element, the input test storage element and the output test storage element each comprises at least one flip-flop.

9. The integrated circuit as claimed in claim 1, wherein the input test storage element is configured to form in the work mode an input safety storage element configured to redundantly store the data stored in the input storage element prior to transfer of the data to the logic circuit, and/or wherein the output test storage element is configured to form in the work mode an output safety storage element configured to redundantly store the data stored in the output storage element after transfer of the data from the logic circuit.

10. The integrated circuit as claimed in claim 1, further comprising:
at least one additional output storage element; and
at least one additional output test storage element,
wherein the at least one logic circuit comprises a plurality of logic circuits, and
wherein during the connection of the logic circuit to the input test storage element and the output test storage element the plurality of logic circuits together with the input test storage element, the output test storage element and the at least one additional output test storage element forms a scan chain,
wherein the at least one additional output storage element is not part of the scan chain.

11. The integrated circuit as claimed in claim 10,
wherein the logic circuit connected to the input test storage element and to the output test storage element forms, together with the input test storage element and the output test storage element, a first chain link of the scan chain, and
wherein each additional chain link of the scan chain comprises one of the plurality of logic circuits, which is connected to the output test storage element of the preceding chain link on the input side and is connected to a further output test storage element on the output side.

12. The integrated circuit as claimed in claim 11,
wherein the output test storage element of a preceding chain link provides to each of the logic circuits of the additional chain links the test data processed by the logic circuit of the preceding chain link, and
wherein each of the logic circuits of the additional chain links feeds the test data processed by it to the output test storage element on the output side.

13. A method for operating an integrated circuit with self-test circuit, said integrated circuit comprising at least one logic circuit, at least one input storage element for storing work data, at least one output storage element, at least one input test storage element for storing test data and at least one output test storage element, wherein the logic circuit is selectively connected to the output storage element and to an output test storage element on the output side of the logic circuit, the method comprising:
when the logic circuit is connected to the input storage element on an input side of the logic circuit:
providing the work data to the logic circuit by means of the input storage element,
feeding the work data processed by the logic circuit to the output storage element, and
processing the work data from the logic circuit in the output storage element; and
when the logic circuit is connected to the input test storage element on the input side of the logic circuit:
providing the test data to the logic circuit by means of the input test storage element,
feeding the work data processed by the logic circuit to the output test storage element and to the output storage element;
ignoring the data from the logic circuit in the output storage element; and
loading the test data into the input test storage element while the logic circuit is connected to the input storage element.

14. The method as claimed in claim 13, furthermore comprising switching over between:
the connection of the input side of the logic circuit to the input storage element and an activated output storage element, and
the connection of the input side of the logic circuit to the input test storage element and a deactivated output test storage element.

15. The method as claimed in claim 14,
wherein the integrated circuit comprises a controller and a multiplexer.

16. The method as claimed in claim 15, furthermore comprising:
providing a switching signal having a first signal value for the purpose of connecting the input side of the logic circuit to the input storage element and for the purpose of activating the output storage element; and
providing a switching signal having a second signal value for the purpose of connecting the input side of the logic circuit to the input test storage element and for the purpose of deactivating the output storage element,
wherein the switching signal is provided at least to the multiplexer and to the output storage element,
wherein the first signal value switching signal and the second signal value switching signal are provided to the multiplexer in an alternating fashion.

17. The method as claimed in claim 13, furthermore comprising:
providing a switching signal having a first signal value to the multiplexer for the purpose of connecting the input side of the logic circuit to the input storage element and for the purpose of activating the output storage element; and
providing a switching signal having a second signal value to the multiplexer for the purpose of connecting the input side of the logic circuit to the input test storage element and for the purpose of deactivating the output storage element,
wherein the first signal value switching signal and the second signal value switching signal are provided to the multiplexer in an alternating fashion.

18. The method as claimed in claim 17,
wherein the input storage element, the output storage element, the input test storage element and the output test storage element each comprises at least one flip-flop,
wherein the at least one flip-flop of the output storage element has an enable input and/or a clock enable input, to which the switching signal is provided.

19. The method as claimed in claim 17,
wherein the switching signal is provided to a control input of the multiplexer.

20. The method as claimed in claim 13,
wherein the input storage element, the output storage element, the input test storage element and the output test storage element each comprises at least one flip-flop.

21. The method as claimed in claim 13,
wherein the input test storage element is configured to form an input safety storage element in a work mode, wherein the method further comprises redundantly storing in the input safety storage element the work data stored in the input storage element prior to transfer of the work data to the logic circuit, and/or wherein the output test storage element is configured to form an output safety storage element in the work mode, wherein the method further comprises redundantly storing in the output safety storage element the work data stored in the output storage element after transfer of the work data from the logic circuit.

22. The method as claimed in claim 13, wherein the integrated circuit further comprises at least one additional output storage element, and at least one additional output test storage element, wherein the at least one logic circuit comprises a plurality of logic circuits, and wherein during the connection of the logic circuit to the input test storage element and the output test storage element the plurality of logic circuits together with the input test storage element, the output test storage element and the at least one additional output test storage element forms a scan chain, wherein the at least one additional output storage element is not part of the scan chain.

23. The method as claimed in claim 22,
wherein the logic circuit connected to the input test storage element and to the output test storage element forms, together with the input test storage element and the output test storage element, a first chain link of the scan chain, and wherein each additional chain link of the scan chain comprises one of the plurality of logic circuits, which is connected to the output test storage element of the preceding chain link on the input side and is connected to a further output test storage element on the output side.

24. The method as claimed in claim 23, further comprising:
providing the test data processed by the logic circuit of one of the chain links as test data to the logic circuit of a succeeding chain link, and
feeding the test data processed by the logic circuit of the last chain link to the output test storage element connected to the logic circuit of the last chain link on the output side.

* * * * *